(12) United States Patent
Kondoh et al.

(10) Patent No.: US 6,407,401 B1
(45) Date of Patent: Jun. 18, 2002

(54) PHOTOCONDUCTIVE RELAY AND METHOD OF MAKING SAME

(75) Inventors: You Kondoh, Yamato; Yasuhisa Kaneko, Kawasaki; Tsutomu Takenaka, Hachioji, all of (JP)

(73) Assignee: Agilent Technologies, Inc., Palo Alto, CA (US)

( * ) Notice: Subject to any disclaimer, the term of this patent is extended or adjusted under 35 U.S.C. 154(b) by 32 days.

(21) Appl. No.: 09/595,771

(22) Filed: Jun. 16, 2000

(51) Int. Cl.⁷ .............................................. G02B 27/00
(52) U.S. Cl. ....................... 250/551; 250/239
(58) Field of Search ...................... 250/214 SW, 239, 250/227.11, 227.22, 227.21, 221, 551, 216, 208.1; 200/60, 61.02, 61.27; 257/80–85

(56) References Cited

U.S. PATENT DOCUMENTS 5,233,178 A * 8/1993 Tokunaga ................. 250/208.1
RE35,069 E * 10/1995 Hallenbeck et al. ......... 250/216
5,734,156 A * 3/1998 Dahlin et al. ................ 250/216

FOREIGN PATENT DOCUMENTS

JP      09161640 A      6/1997      .......... H01H/61/00

* cited by examiner

Primary Examiner—Robert H. Kim
Assistant Examiner—Jurie Yun
(74) Attorney, Agent, or Firm—Ian Hardcastle

(57) ABSTRACT

A photoconductive relay that comprises a light-emitting device, a photoconductive switching element and columns of a conductive, fusible material. The light-emitting device and the photoconductive switching element respectively include including a light-emitting region and a light-receiving region. The columns extend between the light-emitting device and the photoconductive switching element to locate the light-emitting region of the light-emitting device opposite the light-receiving region of the photoconductive switching element and separated from one another by a distance of no more than 100 μm.

17 Claims, 4 Drawing Sheets

PHOTOCONDUCTIVE RELAY AND METHOD OF MAKING SAME

FIELD OF THE INVENTION

The invention relates to photoconductive relays composed of a light-emitting device and a photoconductive switching element, and, in particular, to a photoconductive relay suitable for use in microwave and other switching applications in which the photoconductive relay is structured to have enhanced performance, a reduced size and a lower manufacturing cost.

BACKGROUND OF THE INVENTION

A small, very-high-speed photoconductive relay can be made by combining a photoconductive switching element with a light-emitting device such as a laser or a light-emitting diode. The photoconductive switching element includes a layer structure composed of one or more Group III–V semiconductors, typically GaAs or InP, having different band-gap energies. Two electrodes are located on the surface of the layer structure and are separated by a narrow gap. The portion of the surface of the layer structure exposed in the gap between the electrodes defines a light-receiving region. The photoconductive relay is switched by illuminating the light-receiving region of the photoconductive switching element with light generated by the light-emitting device.

The ON resistance of the photoconductive relay depends inversely on the intensity of the light that illuminates the light-receiving region. The generally-diverging light beam emitted by the light-emitting device must be accurately concentrated on the light-receiving region. Conventionally, lenses, optical fibers or a combination of both have been used to couple the light from the light-emitting device to the light-receiving region of the photoconductive switching element. Correctly aligning such elements relative to the photoconductive switching element and the light-emitting device at low cost and in large volumes has proven challenging, however.

Japanese Published Patent Application No. 6-18554 discloses a probe device for measuring high-frequency signals using a photoconductive switch. Pulses of light produced by a light source, which may be a semiconductor laser, for example, are directed by an optical system consisting of an optical fiber and a collimator lens to illuminate a photoconductive switching element. The photoconductive switching element is electrically connected to conductors located on the surface of a substrate, and controls the flow of signal current through the conductors. The above-mentioned patent application states that the need for a complex light transmission system can be obviated if a semiconductor laser is used as the light source and if the semiconductor laser can be mounted in direct contact with the substrate in the vicinity of the photoconductive switching element.

The above-mentioned published patent application also discloses a structure in which a photoconductive switching element is sandwiched between a measurement chip and a transparent electrode covering the end face of the core of an optical fiber.

As mentioned above, mounting the light source in direct contact with the substrate of the photoconductive switching element offers the possibility of reducing the overall size of a photoconductive relay. Because the light-receiving region of a high-speed photoconductive switching element is small, and because it is preferable to minimize the resistance between the terminals of the photoconductive switching element, i.e., the ON resistance, it is desirable for as much as possible of the light emitted by the light source to be concentrated into the light-receiving region. To help meet these objectives, the distance between the light source and the light-receiving region of the photoconductive switching element should be reduced and the in-plane accuracy with which the light source is positioned relative to the light-receiving region should be increased. Moreover, as the photoconductive relay is made smaller, the accuracy with which the in-plane positioning must be performed increases. However, it is also desirable for the manufacturing process to be simple. It should be possible to position the light source relative to the light-receiving region of the photoconductive switching element with the required accuracy rapidly and at low cost. Also, the number of photoconductive relays rejected for inaccurate positioning should be small.

It is also preferable for the materials surrounding the photoconductive switching element to have a low dielectric constant to reduce the interterminal capacitance of the photoconductive switching element in its OFF state, i.e., the OFF capacitance.

It is also preferable to minimize the cross-talk between the activation signal of the photoconductive relay, i.e., the current fed to the light source to cause it to emit light, and the information signal switched by the photoconductive relay.

Furthermore, heat generated by the activation current flowing through the light source should not impair the physical and electrical properties of the photoconductive relay.

Finally, the photoconductive relay should be capable of incorporating new, improved new light sources or photoconductive elements without incurring significant tooling costs.

SUMMARY OF THE INVENTION

The invention provides a photoconductive relay that comprises a light-emitting device, a photoconductive switching element and columns of a conductive, fusible material. The light-emitting device and the photoconductive switching element respectively include including a light-emitting region and a light-receiving region. The columns extend between the light-emitting device and the photoconductive switching element to locate the light-emitting region of the light-emitting device opposite the light-receiving region of the photoconductive switching element and separated from one another by a distance of no more than 100 $\mu$m.

The invention also provides a method of making a photoconductive relay. In the method, a light-emitting device having a major surface including a light-emitting region and a photoconductive switching element having a major surface including light-receiving region are provided. Conductive pads are formed on the major surface of the light-emitting device and connecting pads are formed on the major surface of the photoconductive switching element. Bumps of a conductive, fusible material are formed on the conductive pads or the connecting pads. The light-emitting device and the photoconductive switching element are positioned with the major surfaces opposite one another and the bumps contacting the conductive pads or the connecting pads. The bumps are heated to melt them. The molten bumps move the light-emitting device or the photoconductive switching element relative to the other to align the light-emitting region and the light-receiving region, and to define the separation between the major surfaces. Finally the molten bumps are cooled to solidify them into columns that interconnect the light-emitting device and the photoconductive switching element with the separation no more than 100 μm.

The invention provides a compact, high-speed photoconductive relay in which the light-emitting region of the light-emitting device is mounted by columns at a defined, small separation from, and in accurate in-plane alignment with, the light-receiving region of the photoconductive switching element. This allows the light-emitting device to illuminate the light-receiving region of the photoconductive switching element directly with a high intensity, without the need to provide and align such elements as lenses and optical fibres. Also, the accurate, reproducible alignment provides a very high coupling efficiency, which reduces the ON resistance of the photoconductive switching element. The closely-mounted light-emitting device minimally increases the OFF capacitance of the photoconductive switching element. Furthermore, it is possible to use the structure and method described above to construct integrated circuits that include multiple high-performance photoconductive relays or a combination of one or more high-performance photoconductive relays and integrated electronic circuits.

DETAILED DESCRIPTION OF THE INVENTION

Figure 1:
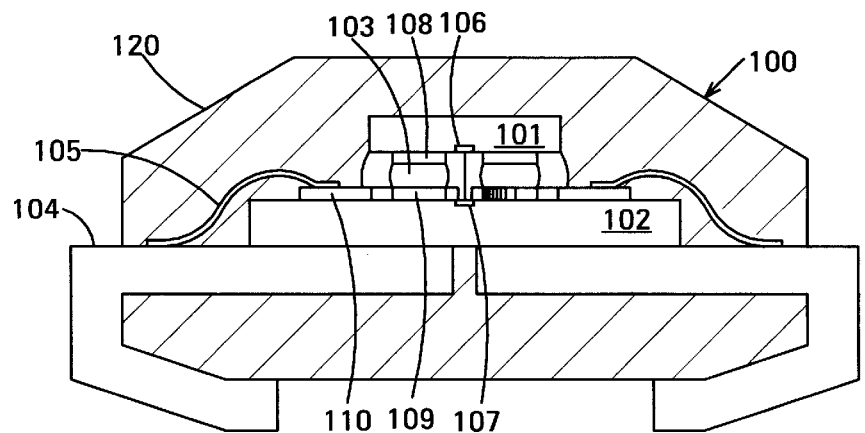
FIG. 1 is a front view of a first example of a photoconductive relay according to the invention with part of the encapsulating epoxy resin removed.

In a photoconductive relay that combines a light-emitting device with a photoconductive switching element, it is important for the light generated by the light-emitting device to be transferred to the light-receiving region of the photoconductive switching element with as little intensity loss as possible. This can be achieved by aligning the optical centers of the light-emitting region of the light-emitting device and the light-receiving region of the photoconductive switching element, and by minimizing the distance between the light-emitting device and the photoconductive switching element. A typical light-emitting device has a broad irradiation pattern, and therefore normally requires a lens or other optical element to couple the whole irradiation pattern to the light-receiving region. However, such lens or other optical element can be omitted if the light-emitting device is mounted very close to the light-receiving region of the photoconductive switching element and the in-plane alignment between the light-emitting region of the light-emitting device and the light-receiving region of the photoconductive switching element is accurate. If the in-plane alignment is not accurate, some of the light in the irradiation pattern will fall outside the light-receiving region. Light that falls outside the light-receiving region cannot contribute to lowering the ON resistance of the photoconductive switching element. Also, since the intensity of the light falling on the light-receiving region is inversely proportional to the square of the separation between the photo-conductive switching element and the light-emitting device, reducing the separation between the light-emitting device and the photoconductive switching element will increase the intensity of the light falling on the light-receiving region and lower the ON resistance of the photoconductive switching element.

The photoconductive relay according to the invention maximizes the intensity of the light falling on the light-receiving region of the photoconductive region but does not transmit the light using lenses or optical fibers that have their attendant alignment problems. Instead, the light-emitting device is mounted on the photoconductive switching element with a small separation between them and with an accurate in-plane alignment between the light-emitting region of the light-emitting device and the light-receiving region of the photoconductive switching element. As a result, the light generated by the light-emitting device directly illuminates the light-receiving region of the photoconductive switching element. The separation between the light-emitting device and the photoconductive switching element is defined, and the in-plane alignment between the light-emitting region and the light-receiving region is automatically performed during assembly by columns of a conductive, fusible material that extend between the light-emitting device and the photoconductive switching element. This approach simplifies the structure of the photoconductive relay, which keeps the photoconductive relay small, simplifies the manufacturing process and reduces the cost of alignment during production.

Figure 2:
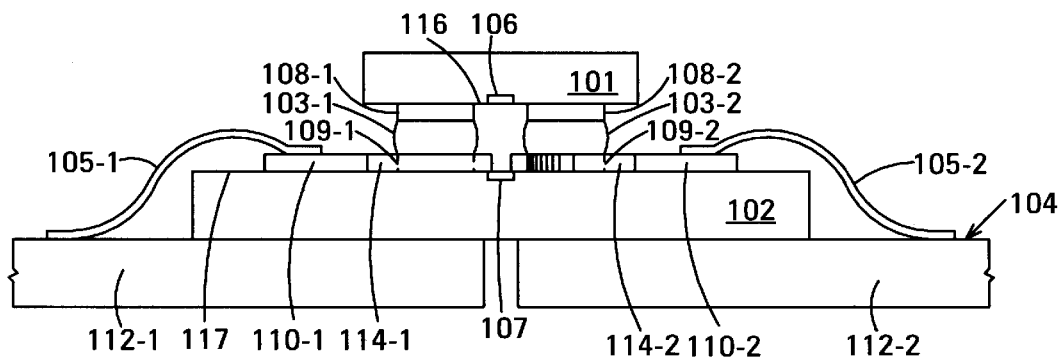
FIG. 2 is an enlarged front view of the photoconductive relay shown in FIG. 1 in which all of the encapsulating resin has been removed.
Figure 3:
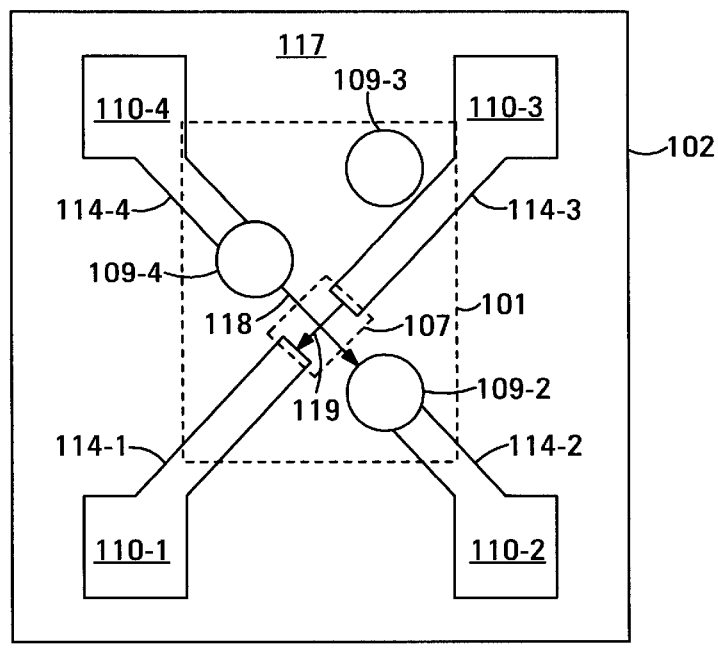
FIG. 3 is a plan view of the major surface of the photoconductive switching element of the example of the photoconductive relay shown in FIG. 1.

FIG. 1 is a front view of an embodiment 100 of a photoconductive relay according to the invention with part of the encapsulating epoxy resin 120 removed. FIG. 2 shows the photoconductive relay shown in FIG. 1 in greater detail and with all of the epoxy resin 120 removed. FIG. 3 is a plan view of the major surface 117 of the photoconductive switching element 102 in which the light-receiving region 107 is located.

The photoconductive relay 100 is composed of the light-emitting device 101, the photoconductive switching element 102 and the columns 103 of a conductive, fusible material. The major surface 116 of the light-emitting device includes the light-emitting region 106 and the major surface 117 of the photoconductive switching element includes the light-receiving region 107. The columns extend between the major surface 116 of the light-emitting device and the major surface 117 of the photoconductive switching element to locate the light-emitting region 106 precisely opposite the light-receiving region 107 of the photoconductive switching element, and separate the light-emitting region from the light-receiving region by a distance of no more than 100 μm.

The light-emitting device 101 is preferably a laser or a light-emitting diode that emits light from the light-emitting region 106. The conductive pads 108-2 and 108-4 are located on the planar major surface 116 in which the light-emitting region 106 is located and from which the light-emitting device emits light. A third conductive pad is located on the major surface 116, but is hidden behind the conductive pad 108-2 in FIGS. 1 and 2. The conductive pads 108-2 and 108-4 additionally serve as electrodes through which an activation current can be fed to the light-emitting device to cause the light-emitting device to emit light.

The connecting pads 109-2, 109-3 and 109-4 are located on the major surface 117 of the photoconductive switching element 102. The major surface 117 is the surface of the photoconductive switching element in which the light-receiving region 107 is located. The connecting pad 109-3 is hidden behind the connecting pad 109-2 in FIGS. 1 and 2.

The columns 103-2 and 103-4 respectively mechanically and electrically connect the connecting pads 109-2 and 109-4 to the conductive pads 108-2 and 108-4. A third column (not shown) connects the connecting pad 109-3 to the third conductive pad, but is hidden behind the column 103-2 in FIGS. 1 and 2.

Also located on the major surface 117 of the photoconductive switching element 102 are the bonding pads 110-1, 110-2, 110-3 and 110-4 and the conductive tracks 114-1, 114-2, 114-3 and 114-4. The conductive tracks 114-1 and 114-3 are electrically connected to the bonding pads 110-1 and 110-3, respectively, and provide the electrodes of the photoconductive switching element 102. The conductive tracks 114-2 and 114-4 electrically connect the bonding pads 110-2 and 110-4 to the connecting pads 109-2 and 109-4.

The photoconductive switching element 102 is attached to the metal lead frame 104 by a conductive paste (not shown). The bonding pads 110-1, 110-2, 110-3 and 110-4 are bonded by bonding wires to the leads of the lead-frame. Only the bonding pads 110-1 and 110-2, the bonding wires 105-1 and 105-2 and the leads 112-1 and 112-2 are shown in FIG. 2.

In this disclosure, the conductive pads 108-2 and 108-4 will be collectively referred to as the conductive pads 108; the connecting pads 109-2 through 109-4 will be collectively referred to as the connecting pads 109; the columns 103-2 and 103-4 will be collectively referred to as the columns 103; the bonding pads 110-1 through 110-4 will be collectively referred to as the bonding pads 110, the leads 112-1 and 112-2 will be collectively referred to as the leads 112 and the conductive tracks 114-1 through 114-4 will be collectively referred to as the conductive tracks 114.

In the example shown, the light-emitting device 101 and the photo-conductive switching element 102 are encapsulated by the epoxy resin 120. Preferably, the encapsulation process is performed in a manner that prevents the epoxy resin from filling the gap between the light-receiving region 107 of the photoconductive switching element and the light-emitting region 106 of the light-emitting device. This prevents material with a high dielectric constant from being located near the photoconductive switching element, which reduces the OFF capacitance of the photoconductive switching element. Alternatively, the photoconductive switching element and the light-emitting device may be housed in a ceramic package. In preference to epoxy, the gap between the light-receiving region and the light-emitting region is filled with a gas such as air or one or more relatively inert gases such as nitrogen, argon, etc. Alternatively, the gap may be evacuated.

It can be seen from FIGS. 1–3 that the photoconductive relay 100 lacks elements such as lenses and optical fibres, and that the light-emitting device 101 and the photoconductive switching element 102 are unencapsulated prior to final assembly, and are mounted with a small separation between them. These structural factors enable the overall size of the photoconductive relay 100 to be smaller than a conventional photoconductive relay. The smaller size reduces the length of the electrical conductors compared with a conventional photoconductive relay, so the photoconductive relay is capable of switching signals having a higher frequency.

The conductive pads 108 and the connecting pads 109 preferably have a multilayer structure of nickel and gold, for example. The material of the pads should be capable of being wet by the conductive, fusible material of the columns 103 when this material is molten. The preferred material of the conductive columns is a tin-lead alloy or tin-lead eutectic. Other materials for the columns can be regarded as being fusible if their melting points are lower than a temperature that degrades the physical and electrical properties of the light-emitting device 101 and the photoconductive switching element 102. Examples of other materials useable for the columns are tin, lead, indium, antimony, bismuth, alloys of these metals, and alloys of these metals with one or both of silver and gold. The columns 103 mechanically and electrically connect the conductive pads 108 to the connecting pads 109, and define the in-plane alignment and the separation of the light-emitting region 106 and the light-receiving region 107.

As noted above, the separation between the light-emitting region 106 and the light-receiving region 107 should be as small as possible, and in any case should be no more than 100 $\mu$m, so that the intensity of the light generated by the light-emitting device 101 on the light-receiving region of the photoconductive switching element 102 will be as high as possible. The height of the columns 103 in the example shown is approximately 30 $\mu$m, and their diameter approximately 50 $\mu$m. It was found that the separation between the light-emitting region and the light-receiving region can be set to 10 $\mu$m or even less by appropriately adjusting the height of the columns. This smaller separation further decreases the ON resistance of the photoconductive switching element, but requires smaller-diameter columns that may be more difficult to fabricate and handle in mass-production.

As will be described in detail below, the conductive, fusible material that, when solidified, forms the columns 103, has a self-aligning effect that accurately and automatically sets the in-plane alignment between the light-emitting region 106 and the light-receiving region 107 and additionally automatically defines the separation between the light-emitting region and the light-receiving region.

FIG. 3 is a plan view of the major surface 117 of the photoconductive switching element 102 of a first example of the invention. The in-plane position of the light-emitting device 101 is also shown. The conductive traces 114-1 and 114-3 extend from the bonding pads 110-1 and 110-3, respectively, towards the center of the major surface to provide the electrodes of the photoconductive switching element. The electrical connection between the bonding pads 110-1 and 110-3 is made or broken depending on whether the photoconductive switching element is in its ON state or its OFF state. The state of the photoconductive switching element depends whether on or not the light-emitting device is generating light. The conductive traces 114-2 and 114-4 extend from the bonding pads 110-2 and 110-4 to the connecting pads 109-2 and 109-4, respectively. When the photoconductive relay 100 is assembled by bonding the light-emitting device 101 to the columns 103, a voltage applied between the bonding pads 110-2 and 110-4 will cause an activating current to flow to activate the light-emitting device. The activating current causes the light-emitting region 106 (FIG. 2) of the light-emitting device to emit light. The light illuminates the light-receiving region 107 of the photoconductive switching element and turns the photoconductive switching element ON. The electrical resistance between the bonding pads 110-1 and 110-3 is substantially reduced in the ON state of the photoconductive switching element. The direction of the activation current flow through the light-emitting device 101 is indicated by the arrow 118. The resulting flow of signal current between the electrodes of the photoconductive switching element is indicated by the arrow 119.

The conductive traces 114-1 and 114-3 preferably extend between the bonding pads 110-1 and 110-3 in an approximately straight line and the conductive traces 114-2 and 114-4 preferably extend between the bonding pads 110-2 and 110-4 in an approximately straight line, orthogonal to the straight line defined by the conductive traces 114-1 and 114-3. With this arrangement, the activation current flows through the light-emitting device 101 in the direction indicated by the arrow 118 and the signal current flows through the photoconductive switching element 102 in the direction indicated by the arrow 119. Arranging the directions 118 and 119 substantially orthogonal to one another minimizes crosstalk from the activation current to the signal current.

The connecting pad 109-3 has no substantial electrical action, and simply supports the above-mentioned third column (not shown) required in addition to the columns 103-1 and 103-2 to define the relative positions of the light-emitting device 101 and the photoconductive switching element 102. A corresponding third conductive pad (not shown) exists on the light-emitting device 101. Additional sets of conductive pads, connecting pads and columns can be provided for such purposes as improving the alignment accuracy by statistical effects, providing an electrical and mechanical shield around the photoconductive switch, and communicating with other electrical elements on the light-emitting device 101.

Figure 4:
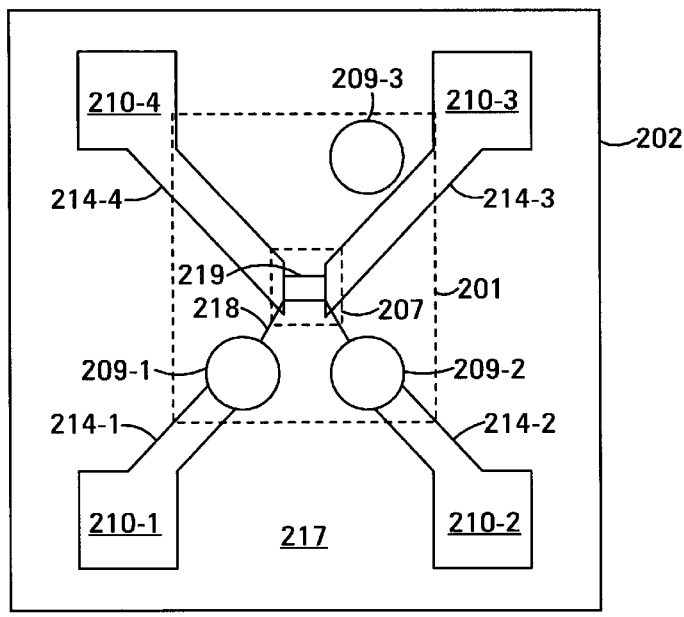
FIG. 4 is a plan view of the major surface of the photoconductive switching element of a second example of a photoconductive relay according to the invention.

FIG. 4 is a plan view of the major surface 217 of the photoconductive switching element 202 of a second example of the invention. The in-plane position of the light-emitting element 201 is also shown. The photoconductive switching element 202 has a similar structure as the photoconductive switching element 102, but the disposition of the conductive traces 214 is different from that of the conductive traces 114, and the path of the activation current of the light-emitting device 201 is oriented differently from that of the signal current flowing through the photoconductive switching element 202.

The conductive traces 214-3 and 214-4 extend from the bonding pads 210-3 and 210-4, respectively, towards the center of the major surface 217 to provide the electrodes of the photoconductive switching element 202. The electrical connection between the bonding pads 210-3 and 210-4 is made or broken according to whether the photoconductive switching element is in its ON state or its OFF state, as described above. The conductive traces 214-1 and 214-2 extend from the bonding pads 210-1 and 210-2 to the connecting pads 209-1 and 209-2, respectively. When the photoconductive relay is assembled by mounting the light-emitting device 201 on the columns, a voltage applied between the bonding pads 210-1 and 210-2 will cause an activation current to flow to activate the light-emitting device. The activation current causes the light-emitting device to emit light. The direction in which the activation current flows through the light-emitting device 101 is indicated by the line 218.

In this example, the conductive traces 214-4 and 214-3 preferably extend approximately orthogonally relative to one another. Also, the activation current path from the bonding pad 210-1 through the conductive trace 214-1 and the connecting pad 209-1 to the light-emitting device, and the activation current path from the light-emitting device through the connecting pad 209-2 and the conductive trace 214-2 to the bonding pad 210-2 are both preferably approximately straight lines disposed orthogonally to one another. Moreover, the directions of the conductive trace 214-1 and the conductive trace 214-4 are also approximately orthogonal to one another. The structure shown in FIG. 4 may be more convenient because the bonding pads 210-1 and 210-2 though which the activation current flows and the bonding pads 210-3 and 210-4 through which the signal current flows are located on opposite sides of the major surface 217.

The connecting pad 209-3 has no substantial electrical action, and simply supports the above-mentioned third column (not shown) that is required to define the relative positions of the light-emitting device 201 and the photoconductive switching element 202. A corresponding third conductive pad (not shown) exists on the light-emitting device. Additional sets of conductive pads, connecting pads and columns can be provided as described above.

The effect of the activation current of the light-emitting devices 101 and 201 on the signal current through the respective photoconductive switching elements 102 and 202 can be minimized in the above-described examples by using equilibrium activation for activating the light-emitting devices.

Figure 5:
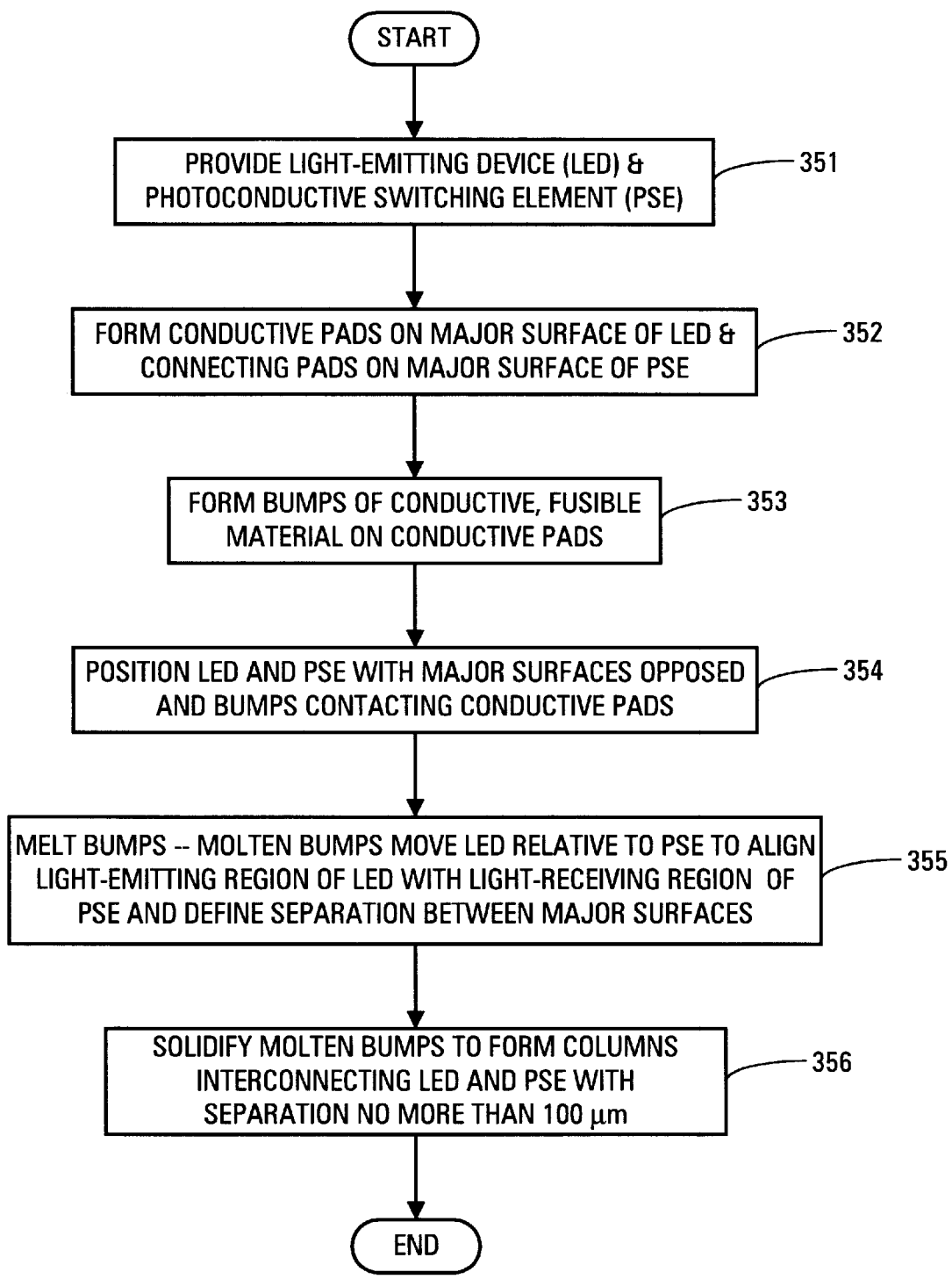
FIG. 5 is a flow chart illustrating an embodiment of the method according to the invention for making the photoconductive relay according to the invention.

The method according to the invention for making the photoconductive relay 100 according to the invention will now be described with reference to FIG. 5. When the photoconductive relay is assembled, the light-emitting region of the light-emitting device and the light-receiving region of the photoconductive switching element must be accurately aligned relative to one another, and the separation between the light-emitting device and the photoconductive switching element must also be accurately defined. This is done according to the invention by coupling the light-emitting device to the photoconductive switching element by flip-chip bonding, as illustrated in FIGS. 5 and 6A–6C. Alternatively, the photoconductive switching element can be coupled to the light-emitting device by flip-chip bonding. The latter approach may allow the heat generated by the light-emitting device to be more easily dissipated.

FIG. 5 illustrates an embodiment of the method according to the invention for making the photoconductive relay 100 (FIG. 2) according to the invention in which the light-emitting device 101 is coupled to the photoconductive switching element 102. The method illustrated can easily be adopted to couple the photoconductive switching element to the light-emitting device. In this case, the photoconductive switching element would be located above the light-emitting device is FIGS. 6A–6C.

Figure 6A:
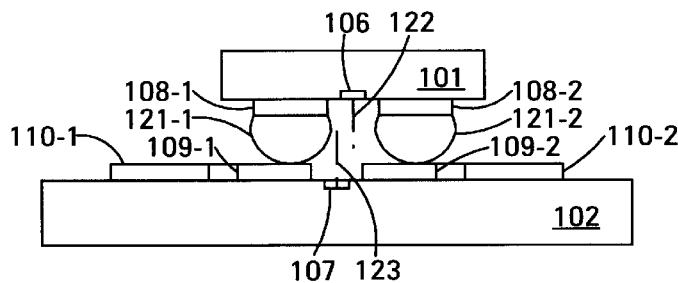
FIGS. 6A, 6B and 6C are front views of the first example of the photoconductive relay according to the invention at various stages of its manufacture using the method illustrated in FIG. 5.

Referring to FIG. 5 and FIG. 6A, in process 351, the light-emitting device 101 and the photoconductive switching element 102 are provided. The light-emitting device has a planar major surface 116 that includes the light-emitting region 106. The photoconductive switching element has a planar major surface 117 that includes the light-receiving region 107. Devices suitable for use as the photoconductive switching element are described in U.S. patent application Ser. No. 09/337,045 assigned to the assignee of this disclosure, and which is incorporated herein by reference.

In process 352, the conductive pads 108 are formed on the major surface 116 of the light-emitting device 101, and the connecting pads 109 are formed on the major surface 117 of the photoconductive switching element 102. Techniques for forming pads of defined shapes and sizes in defined locations on the surface of semiconductor devices are known in the art and will not be described further here.

In process 353, bumps 121 of a conductive, fusible material are formed on the conductive pads 108. The material of the bumps is fusible in the sense that its melting point is below a temperature that would degrade the physical and electrical properties of the light-emitting device 101 and the photoconductive switching element 102. Techniques for forming bumps of defined volumes of solder and other conductive, fusible materials on suitably-sized and shaped pads are known in the art and will not be described further here.

In process 354, the light-emitting device 101 is placed on the photoconductive switching element 102 with the major surfaces 116 and 117 opposed and is positioned with the bumps 121 contacting respective ones of the contacting pads 109. FIG. 6A shows the bumps 121-1 and 121-2. The term bumps 121 is a collective term for the bumps 121-1, 121-2, . . . , of which only the bumps 121-1 and 121-2 are shown.

The light-emitting device 101 may be placed on the photoconductive switching element 102 using a commercially-available flip-chip bonder. However, since the in-plane positioning of the light-emitting device in process 354 is substantially less critical than the allowed tolerance of the alignment between the light-emitting region 106 and the light-receiving region 107, a commercially-available automatic mounter for chip components or a manual mounter in which the positioning is done by eye may alternatively be used. The optical centers of the light-emitting region 106 of the light-emitting device and the light-receiving region 107 of the photoconductive switching element, indicated by the center lines 122 and 123, respectively, do not have to be accurately aligned. For practical purposes, the in-plane alignment of the bumps 121 relative to the connecting pads 109 need only be accurate enough to ensure that the bumps contact the connecting pads.

If needed, the connecting pads 109 may be coated with flux or another such surfactant by coating, printing, or another suitable way. The term flux, as used from now on, will be understood to encompass other surfactants. Additionally or alternatively, flux may be applied by transfer-coating to the bumps 121. The flux-applying operation is preferably performed prior to bringing the bumps into contact with their respective connecting pads 109. The flux improves the integrity of the bond that will be later formed between the bumps and the connecting pads. Additionally, the flux temporarily attaches the bumps to the connecting pads 109 and prevents the alignment between the bumps and their respective connecting pads from being disturbed by handling that occurs before a more permanent bond is formed by melting the bumps, as will be described below.

In process 355, the bumps are melted by heating. The light-emitting device 101 and the photoconductive switching element 102 are placed on a stage (not shown) and transferred to a heating apparatus. The heating apparatus either transfers heat to the photoconductive switching element through contact with the stage, or includes a hot atmosphere that transfers heat to the light-emitting device, the photoconductive switching element and the bumps.

Figure 6B:
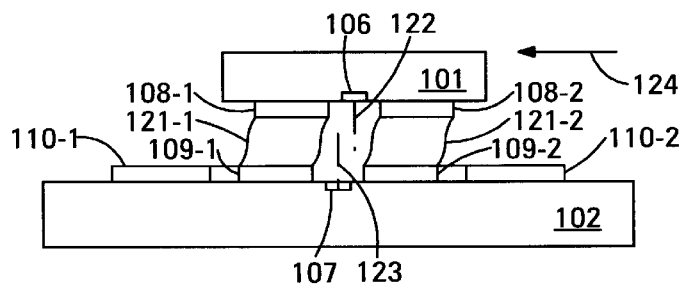

FIG. 6B shows the molten bumps 124, i.e., the bumps 121 after they have melted. The molten bumps wet the connecting pads 109. The surface tension of the molten bumps causes the molten bumps to try to assume their lowest-energy shape, i.e., a shape close to spherical in which the surface area is minimized. The surface tension of the molten bumps moves the light-emitting device 101 relative to the photoconductive switching element 102 in the direction indicated by the arrow 125 until the conductive pads 108 are located opposite the connecting pads 109. In other words, the molten bumps provide a self-alignment action. The motion indicated by the arrow 125 has a component perpendicular to the major surface 117 as the surface tension of the molten bumps draws the light-emitting device towards the photoconductive switching element until the separation between the major surfaces is defined by the geometry assumed by the molten bumps.

If the positions of the conductive pads 108 and the connecting pads 109 are accurately defined relative to the light-emitting region 106 and the light-receiving region 109, respectively, by a method such as photolithography, for example, the self-alignment action of the molten bumps 124 will perform an accurate in-plane alignment between the light-emitting region and the light-receiving region. Additionally, the minimum-energy shape adopted by the molten bumps 121 defines the separation between the major surfaces 116 and 117.

Figure 6C:
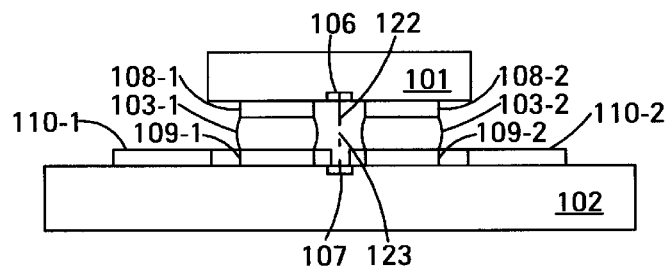

In process 356, the molten bumps 124 are solidified by allowing them to cool. When their temperature falls below the melting point of the conductive, fusible material of the bumps, the molten bumps solidify to form the columns 103. FIG. 6C shows the finished photoconductive relay 100 in which the columns interconnect the light-emitting device 101 and the photoconductive switching element 102. The result of the self-alignment action of the molten bumps 124 shown in FIG. 6B is also shown. The center lines 122 and 123 of the light-emitting region 106 and the light-receiving region 107, respectively, are aligned, and the separation of the major surfaces 116 and 117 is defined and is no more than 100 $\mu$m. The actual separation is determined by the volume of the bumps 121, the areas of the conductive pads 108 and the connecting pads 109 and the surface tension of the conductive, fusible material of the bumps.

Preferably, the heating and cooling processes 355 and 356 are performed by an atmospheric furnace equipped with a conveyor belt that moves the stage carrying the photoconductive switching element 102 through the furnace. The furnace has a temperature profile in which the temperature progressively increases from the entrance to a maximum at a point part-way along the furnace, and then progressively decreases from that point towards the exit of the furnace. The bumps 121 melt when heated to a temperature greater than their melting point. This temperature is about 220° C. when the material of the bumps is a tin-lead alloy, for example.

The heating time will vary with the heating method and the thermal capacity of the elements being heated, but ranges from 30 seconds to a maximum of a few minutes. For instance, when the above-described atmospheric furnace equipped with a conveyor belt is used, the temperature of the elements gradually rises, starting at the entrance of the furnace. The highest temperature is reached at the location part-way through the furnace, and the temperature then decreases towards the exit of the furnace. Consequently, the elements are subject to the highest temperature only for a few seconds.

Figure 7:
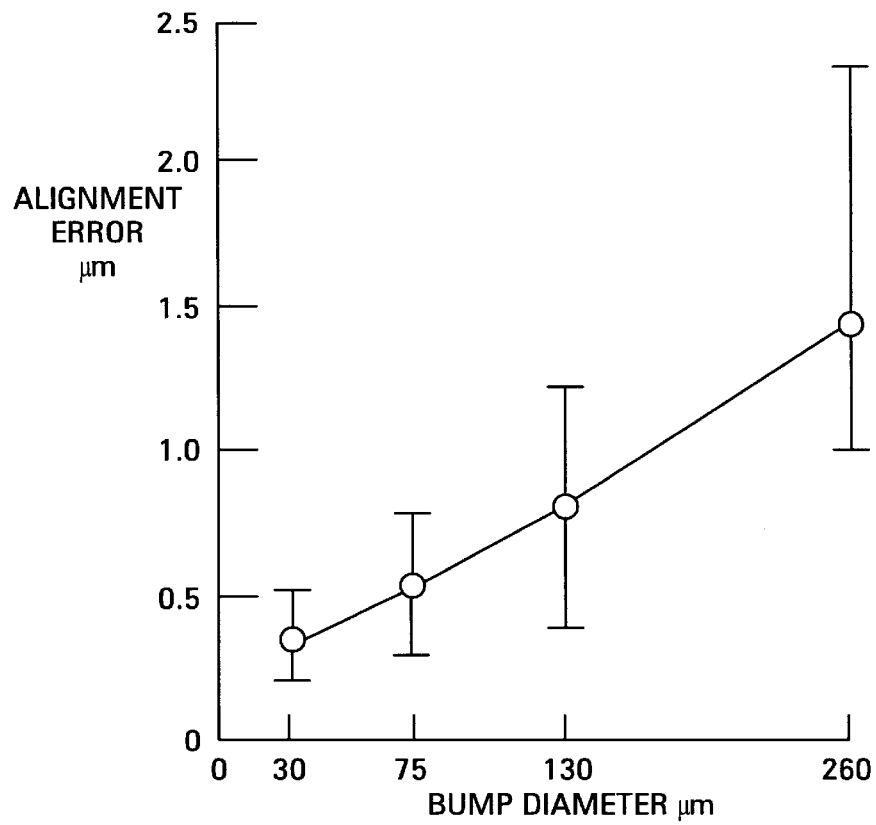
FIG. 7 is a graph showing the results of an experiment that measured the self-aligning effect of molten bumps of various diameters.

FIG. 7 shows the results of an experiment in which the self-alignment effect of the molten bumps 124 was measured. The experiment involved using four bumps of the same shape to bond a silicon chip measuring 3 mm square to a glass substrate. Conductive pads and connecting pads, similar to the conductive pads 108 and the connecting pads 109, were formed on the major surfaces of the silicon chip and the glass substrate, respectively. The pads were defined in a multilayer film of nickel and gold deposited on the major surfaces of the silicon chip and the glass substrate. Bumps of a tin-lead eutectic were formed on the conductive pads on the silicon chip. The sizes of the pads and the solder bumps, and the alignment error between the centers of the chip and the substrate after bonding were measured using a microscope.

The results shown in FIG. 7 indicate that the alignment error is smaller when the diameter of the bumps is smaller. For example, when bumps with a diameter of 30 µm were used, the alignment error was less than 0.5 µm. The experimental results shown can be used to determine the pad size, and, hence, bump size, required to produce an alignment error of less than a desired maximum when the method according to the invention is used to make photoconductive relays according to the invention. It is also possible to reduce the alignment error further by increasing the number of bumps or by changing their arrangement on the major surfaces 116 and 117.

The examples of the photoconductive relay described above with reference to FIGS. 1 through 4 mount the light-emitting device on the photoconductive switching element using three columns 103. This is the minimum number of columns required to define a plane. The precision with which the molten bumps that become the columns align the light-emitting device relative to the photoconductive switching element can be improved by increasing the number of bumps. However, bumps with a small diameter are more difficult to manufacture and to handle. Thus, using smaller-diameter bumps can increase the cost of the photoconductive relay. Consequently, bumps no smaller than the minimum diameter required to achieve the desired separation between the major surfaces of the light-emitting device and the photoconductive switching element should preferably be used.

Metal bumps have a high thermal conductivity, and can be arranged with relative freedom on the major surfaces of the light-emitting device and the photoconductive switching element. Consequently, the bumps can provide a thermally-conductive path through which heat generated by the heat generating components, such as the light-emitting device, can be removed for dissipation elsewhere. This can prevent the heat from impairing the operation of temperature-sensitive circuits. This is an advantage of the present invention that is not obtained when a resin or other material with low thermal conductivity is used to bond the light-emitting device to the photoconductive switching element.

An array of photoconductive relays can be fabricated by flip-chip bonding light-emitting devices to a substrate in which an array of photoconductive switching elements has been formed. Alternatively, an array of photoconductive relays may be fabricated by flip-chip bonding photoconductive switching elements to a substrate in which an array of light-emitting devices has been formed.

Figure 8:
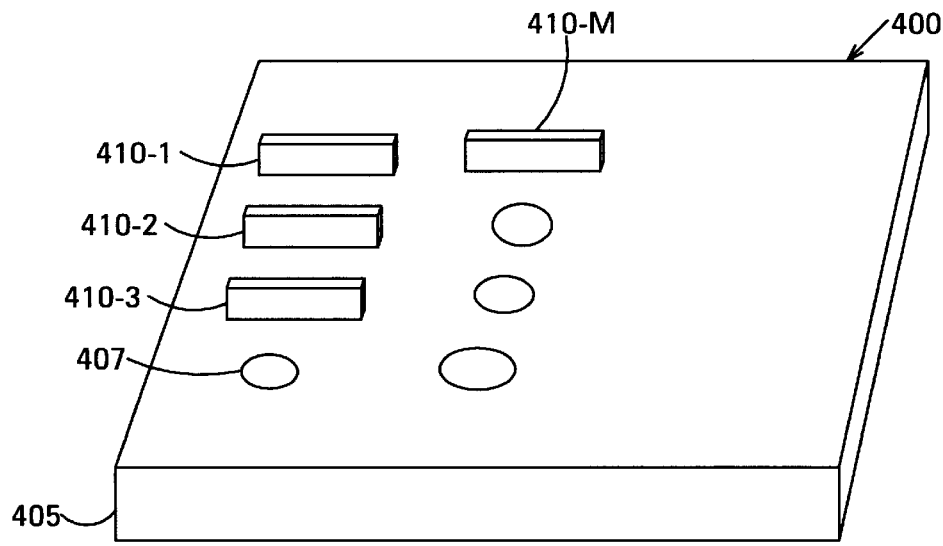
FIG. 8 is a perspective view of a photoconductive relay array in which a number of components are mounted on a substrate to form respective photoconductive relays.

In either of the above cases, it is possible to make integrated circuits having various functions by mounting other circuits on the substrate. FIG. 8 shows the photoconductive relay assembly 400 in which a number of components 410, which is a collective term for the components 410-1, 410-2, . . . , 410-M, are bonded to the substrate 405. If the components 410 are light-emitting devices, for example, they are bonded to the substrate in locations where they illuminate the light-receiving regions of corresponding photoconductive switching elements 407 formed in the substrate 405. The bonding is performed using the method described above, and yields a respective number of photoconductive relays. If the components 410 are photoconductive switching elements, light-emitting devices are formed in the substrate 405 and the components are bonded to the substrate in positions where their light-receiving regions can be illuminated with the light generated by the light generated by the light-emitting devices. The bonding is performed using a "light-emitting device down" version of the method described above, and again yields a respective number of photoconductive relays.

The distances between the photoconductive relays formed in the manner just described, and the distance between each photoconductive relay and the circuit (not shown) with which it operates can be made shorter than when conventional photoconductive relays are used. Moreover, since one or more microstrip lines or similar microwave transmission lines are used to connect the circuit to the photoconductive relays, no bonding wires are needed and the resulting circuit has superior frequency characteristics compared with a conventional approach. In one example, signals having frequencies greater than 2 GHz were switched.

As discussed above, the invention allows a discrete photoconductive relay to be fabricated, or many photoconductive relays to be integrated with one another or with other circuits. The performance of a discrete photoconductive relay according to the invention encapsulated with resin is inferior to the photoconductive relay according to the invention integrated with a circuit or other relays on a common substrate, but the discrete encapsulated photoconductive relay according to the invention can easily be used to replace a conventional relay and provides a performance improvement when this is done.

If the separation between the light-emitting device and the photoconductive switching element is small, a temperature difference between the light-emitting device and the photoconductive switching element can produce thermal stress in the elements. Excessive thermal stress will have a detrimental effect on element performance. It is best for the coefficients of thermal expansion of the light-emitting device and the photoconductive switching element to be close to the coefficient of thermal expansion of at least the substrate, or of the layer where the most thermal stress occurs.

In terms of providing higher performance, the photoconductive switching element should preferably have a structure that includes hetero-junctions in which a photoconductive layer is sandwiched by electron-trapping layers, as described in the above-mentioned U.S. patent application.

The invention can also be applied to a structure in which a phototransistor or a photodiode is used as the photoconductive switching element.

Although this disclosure describes illustrative embodiments of the invention in detail, it is to be understood that the invention is not limited to the precise embodiments described, and that various modifications may be practiced within the scope of the invention defined by the appended claims.

We claim:

1. A photoconductive relay, comprising:
   a light-emitting device including a light-emitting region;
   a photoconductive switching element having a light-receiving region; and
   columns of a conductive, fusible material extending between the light-emitting device and the photoconductive switching element to locate the light-emitting region of the light-emitting device opposite the light-receiving region of the photoconductive switching element and separated therefrom by a distance of no more than 100 μm.

2. The photoconductive relay of claim 1, in which material of the columns is selected from the group consisting of tin, lead, silver, gold, indium, antimony, bismuth, alloys thereof, and alloys thereof with at least one of silver and gold.

3. The photoconductive relay of claim 1, in which:
   the light-emitting device includes an electrode through which an activation current is supplied to the light-emitting device; and
   at least one of the columns is electrically connected to the electrode.

4. The photoconductive relay of claim 1, in which:
   the photoconductive switching element includes an electrode through which a signal current is supplied to the photoconductive switching element; and
   at least one of the columns is electrically connected to the electrode.

5. The photoconductive relay of claim 1, in which the light-emitting device includes one of a light-emitting diode and a planar semiconductor laser.

6. The photoconductive relay of claim 1, in which:
   the photoconductive switching element includes first, second and third layers;
   the second layer is composed of a material having a first energy bandwidth;
   the first layer and the third layer are each composed of a material having an energy bandwidth greater than the first energy bandwidth; and
   the second layer has a resistance that decreases when the photoconductive switching element is irradiated with light generated by the light-emitting device.

7. The photoconductive relay of claim 1, in which activation current flows through the light-emitting device and a signal current flows through the photoconductive switching element near the light-receiving surface in substantially orthogonal directions.

8. The photoconductive relay of claim 7, in which material of the columns is selected from the group consisting of tin, lead, silver, gold, indium, antimony, bismuth, alloys thereof, and alloys thereof with at least one of silver and gold.

9. The photoconductive relay of claim 7, in which:
   the light-emitting device includes an electrode through which an activation current is supplied to the light-emitting device; and
   at least one of the columns is electrically connected to the electrode.

10. The photoconductive relay of claim 7, in which:
    the photoconductive switching element includes an electrode through which a signal current is supplied to the photoconductive switching element; and
    at least one of the columns is electrically connected to the electrode.

11. The photoconductive relay of claim 7, in which the light-emitting device includes one of a light-emitting diode and a planar semiconductor laser.

12. The photoconductive relay of claim 7, in which:
    the photoconductive switching element includes first, second and third layers;
    the second layer is composed of a material having a first energy bandwidth;
    the first layer and the third layer are each composed of a material having an energy bandwidth greater than the first energy bandwidth; and
    the second layer has a resistance that decreases when the photoconductive switching element is irradiated with light generated by the light-emitting device.

13. The photoconductive relay of claim 1, in which:
    the light-emitting region of the light-emitting device is separated from the light-receiving region of the photoconductive switching element by a gap; and
    the gap is filled with one of a vacuum, an inert gas and air.

14. A photoconductive relay assembly, comprising:
    a substrate; and
    an array of the photoconductive relays according to claim 1 integrated in the substrate.

15. The photoconductive relay assembly of claim 14, in which material of the columns is selected from the group consisting of tin, lead, silver, gold, indium, antimony, bismuth, alloys thereof, and alloys thereof with at least one of silver and gold.

16. The photoconductive relay assembly of claim 14, in which:
    the light-emitting device includes an electrode through which an activation current is supplied to the light-emitting device; and
    at least one of the columns is electrically connected to the electrode.

17. The photoconductive relay assembly of claim 14, in which:
    the photoconductive switching element includes an electrode through which a signal current is supplied to the photoconductive switching element; and
    at least one of the columns is electrically connected to the electrode.

* * * * *